United States Patent [19]
Duss

[11] Patent Number: 5,659,468
[45] Date of Patent: Aug. 19, 1997

[54] PROCESS FOR MONITORING AND/OR DETECTING CHANGES UNDER LOAD OF THE OPERATING STATE OF AN ELECTRICAL POWER MACHINE

[75] Inventor: Hanspeter Duss, Gretzenbach, Switzerland

[73] Assignee: Grapha-Holding AG, Hergiswil, Switzerland

[21] Appl. No.: 302,887

[22] PCT Filed: Jan. 10, 1994

[86] PCT No.: PCT/CH94/00004

§ 371 Date: Dec. 29, 1994

§ 102(e) Date: Dec. 29, 1994

[87] PCT Pub. No.: WO94/17496

PCT Pub. Date: Aug. 4, 1994

[30] Foreign Application Priority Data

Jan. 19, 1993 [CH] Switzerland ............... 00148/93

[51] Int. Cl.$^6$ ............................................. G05B 13/02
[52] U.S. Cl. ........................ 364/152; 364/508; 361/23
[58] Field of Search ........................... 364/152, 478, 364/508, 424.04, 569; 340/665, 666, 685; 318/434, 471; 324/772; 361/23, 24, 25

[56] References Cited

U.S. PATENT DOCUMENTS

| 4,636,962 | 1/1987 | Broyden et al. ............... 364/478 |
| 5,133,465 | 7/1992 | Kalan ........................ 364/424.04 |

FOREIGN PATENT DOCUMENTS

| 0110865 | 6/1984 | European Pat. Off. . |
| 2663473 | 12/1991 | France . |
| 2020432 | 11/1979 | United Kingdom . |
| 2090416 | 7/1982 | United Kingdom . |
| 89/07852 | of 1989 | WIPO . |

Primary Examiner—Reba I. Elmore
Assistant Examiner—Steven R. Garland
Attorney, Agent, or Firm—Spencer & Frank

[57] ABSTRACT

A method and apparatus for monitoring and ascertaining respective changes in an operating condition of an electrically operated engine that occur due to stress. Operating parameters are measured to acquire the influences of different types of stresses which promote the wear of the engine. The operating parameters are transferred to an electronic, non-volatile memory module. The operating parameters are converted to respective wear contributions indicative of a degree of wear of the engine. The wear contributions are evaluated to determine the actual wear of the engine at any point in time.

15 Claims, 2 Drawing Sheets

PROCESS FOR MONITORING AND/OR DETECTING CHANGES UNDER LOAD OF THE OPERATING STATE OF AN ELECTRICAL POWER MACHINE

BACKGROUND OF THE INVENTION

The invention relates to a method of monitoring and/or ascertaining respective changes in the operating condition of an electrically operated engine that occur due to stress, by measuring individual operating parameters or a plurality of operating parameters.

Particularly in rope pulley blocks or the like, loads that occur are divided into load ranges of different magnitude by means of a mechanical arrangement, wherein a counter is allocated to each load range which acquires or adds up the respective load time.

The purpose of this acquisition, registering and evaluating of weight loads during a certain load period of an engine is, inter alia, to achieve better operational safety with regard to product liability.

This known type of acquisition of operating parameters of the same kind is complex and not sufficient to allow for reaching a reliable result or making a statement regarding the actual operating condition and the future service life or the life expectancy of an engine.

SUMMARY OF THE INVENTION

Thus, it is the object of the present invention to create a method for monitoring and/or ascertaining respective changes in the operating condition of an electrically operated engine that occur due to use, by means of which the precision of the operating condition monitoring and of the acquisition of the operational data can be considerably improved or optimized in a cost-effective manner.

This object is solved according to the invention in that the acquired operating parameters are transferred to an electronic, non-volatile memory module.

In this manner, a more precise evaluation of the operating condition of an engine can be carried out, wherein both qualitative operating parameters, e.g., a maximum operating temperature reached, and quantitative operating parameters, - the operating time -, can be acquired.

Apart from the individual weight loads, the operating parameters concerned comprise, inter alia, the operating time during which the devices used for the method according to the invention are activated; the operating period during which an engine is working; the number of switching processes for driving an engine; the operating temperatures; the motor output of an engine, e.g., in the form of running periods of individual output ranges.

The method according to the invention proves to be particularly advantageous for measuring stresses of a mechanical or physical nature by acquiring the various influences that promote wear of the engine and by adding or converting them as wear contributions to form corresponding degrees of wear.

In this process, the wear contributions can be respectively converted to a uniform total degree of wear.

The method according to the invention can be used advantageously for measuring individual weight loads while taking the load period into consideration, during which process these stresses are added up, after having been converted to a corresponding wear contribution, when further influences that promote wear of the engine are acquired and, after conversion to a corresponding wear contribution, are added to the wear contributions which codetermine the degree of wear due to the weight loads.

In this manner, a more precise evaluation of the operating condition of an engine can be carried out.

Preferably, the number of switching processes or switching cycles influencing the wear of the engine or the switch-on load moments and switch-off load moments resulting therefrom can be acquired.

Furthermore, the conveying speed can be acquired as a value that increases wear of the engine and can be taken into account in the calculation of the transient wear contribution.

To improve the result of an evaluation of the operating condition of the engine, the acceleration and/or delay of the driving movement can be acquired and added to the existing degrees of wear after conversion to a wear contribution or to wear contributions.

The degree of wear of the engine can also be noticeably influenced by relatively high ambient temperatures, their volatility and/or the heat generated in the engine due to the added energy so that their acquisition and application improve the objectivity of the degree of wear.

For the determination of the degree of wear, further physical loads of the engine, which have a considerable influence on the degree of wear, can be taken into account.

In the evaluation of the degree of wear, the individual physical influences can also be alternatively considered.

Advisably, the degree of wear reached at the engine can be compared to a corresponding adjustable set value and be evaluated.

Advantageously, a signal can be triggered if a set value for a degree of wear or for a certain wear contribution is exceeded.

It proves to be advantageous if the maintenance intervals and inspection intervals are set by determining a set value as degree of wear.

The degree of wear or how it is brought about proves to be suitable for the determination of the (yet to be) expected service life of an engine.

The evaluation of the wear contributions can take place at the electric engine or at a distance from the same, e.g., at a PC.

For the acquisition of the weight load of an electric engine, in particular of a hoist such as, for example, a chain pulley block or rope pulley block, a travelling crane or the like, a slewing crane or an overhead trolley conveyor, an overhead crane, a lifter or of other conveying devices negotiating/traversing a load path or of a processing machine, for example, a drilling machine or a grinding machine, of an electric motor or stacker truck, a wear contribution resulting therefrom can be determined advisably by measuring the effective electric input at at least one winding of the drive motor.

BRIEF DESCRIPTION OF THE DRAWINGS

In the following, the invention is described in an exemplary manner by way of two schematics reflecting an electrically operated engine. These show.

DETAILED DESCRIPTION OF THE INVENTION

Figure 1:
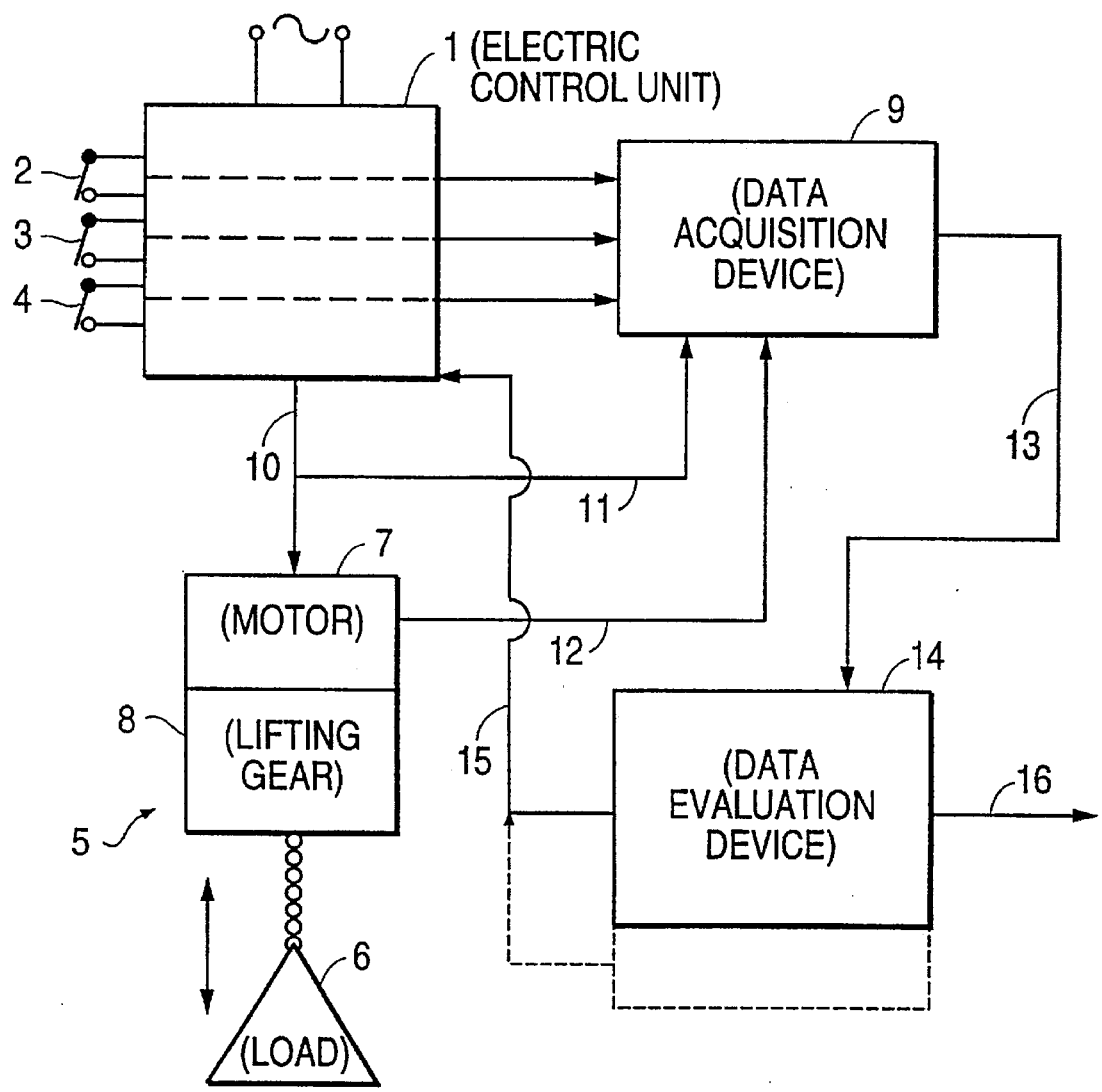
FIG. 1 a schematic circuit diagram relating to the invention for an engine configured as a hoist and FIG. 2 an illustration of the degree of wear based on ascertained wear contributions of a hoist according to FIG. 1.

FIG. 1 shows an electric control unit 1 which can be connected to a power source, with switches 2, 3, 4 being allocated to the control unit for actuating a hoist 5. These switches 2, 3, 4 are provided for the functions lifting, lowering and rapid travel of a load 6 that is to be moved.

The control unit 1 is adjoined by a motor 7 which is electrically connected to the control unit, the motor being coupled with a lifting gear 8.

The switches 2, 3, 4 are also connected to a data acquisition device 9 in which the individual operating parameters are respectively recorded.

One or a plurality of measuring lines 11 are connected to the current line 10, which leads from the control unit 1 to the motor 7 are connected to the data acquisition device 9, through which measuring lines the power consumed by the motor 7 can be mathematically acquired.

For the acquisition of the motor temperature, a further connection 12 leads to the data acquisition device 9. Via a line 13, the data is transmitted in a sorted manner from the data acquisition device 9 to a data evaluation device 14 and they are stored. The data evaluation device 14 or a so-called electronic, non-volatile memory module essentially consists of a microprocessor with a non-volatile memory. The data received is evaluated in the microprocessor, and can be converted to a corresponding uniform wear contribution and/or be further processed.

If the hoist 5 or the motor 7 is overloaded, the further processing also provides the option of switching off the control unit 1 via an emergency stopping line 15 or of switching off the hoist 5.

Outlet line 16 leads to a read-out unit which is not shown, e.g., a PC, which illustrates the data in readable form.

Figure 2:
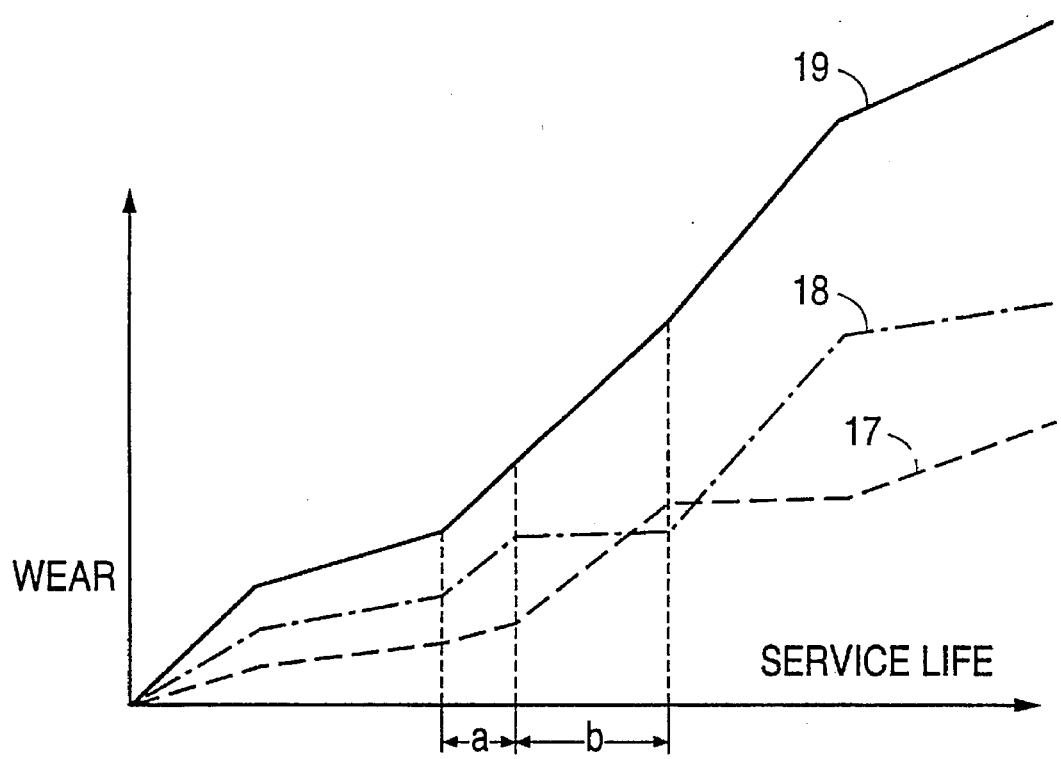

In a diagram, FIG. 2 illustrates in a simple, exemplary manner wear contributions due to physical influences exerted on an engine, which came about in different ways. Thus, inter alia, the wear contributions are shown by the number of switching cycles according to line 17 and by the weight load according to line 18.

The cumulatively acquired wear contributions are characterized by line 19 for the degree of wear of the engine, which appears at the vertical coordinate axis, while the horizontal coordinate axis reflects the service life of the engine.

On the latter, the sections a and b each show different periods and stresses of an engine resulting in wear contributions.

In the shorter time section a, a smaller wear contribution is created because of a certain number of switching processes than is created by the weight load, i. e., in section b, the wear contribution from the weight load is smaller than that of the number of switching processes.

I claim:

1. A method of monitoring and ascertaining respective changes in an operating condition of an electrically operated engine that occur due to stress, comprising the steps of:

measuring operating parameters to acquire the influences of different types of stresses which promote wear of the engine;

transferring the operating parameters to an electronic, non-volatile memory module;

converting the operating parameters to respective wear contributions indicative of a degree of wear of the engine; and evaluating the wear contributions to determine the actual wear of the engine at any point in time.

2. The method defined in claim 1, further comprising the step of converting the wear contributions to a uniform total degree of wear.

3. The method defined in claim 1, wherein the operating parameters of said measuring step include weight loads measured while accounting for the load period; further comprising the step of adding up the wear contributions corresponding to the weight loads after said converting step; and wherein further operating parameters are measured in said measuring step, converted to corresponding wear contributions in said converting step, and added to the wear contributions corresponding to the weight loads in said adding step.

4. The method defined in claim 1, wherein the operating parameters of said measuring step include a number of switching processes of the engine.

5. The method defined in claim 1, wherein the operating parameters of said measuring step include a conveying speed of the engine.

6. The method defined in claim 1, wherein the operating parameters of said measuring step include at least one of an acceleration and delay of a conveying movement of the engine.

7. The method defined in claim 1, wherein the operating parameters of said measuring step include at least one of an acceleration and delay of a driving movement of the engine.

8. The method defined in claim 1, wherein the operating parameters of said measuring step include an engine operating temperature.

9. The method defined in claim 1, further comprising the step of comparing a degree of wear of said evaluating step to a set value, to determine a difference therefrom; and one of utilizing and displaying the difference.

10. The method defined in claim 9, wherein said utilizing step includes using the difference to trigger a signal.

11. The method defined in claim 9, wherein the set value of said comparing step determines one of a maintenance interval and an inspection interval.

12. The method defined in claim 9, wherein the degree of wear of said evaluating step is used for ascertaining a service life of the engine.

13. The method defined in claim 9, wherein the operating parameters of said measuring step include an effective electric input at at least one winding of a drive motor of the engine.

14. An apparatus for monitoring and ascertaining respective changes in an operating condition of an electrically operated engine that occur due to stress, comprising:

means for measuring operating parameters for acquiring influences of different types of stresses which promote wear of the engine;

means for transferring the operating parameters to an electronic, non-volatile memory module;

means for converting the operating parameters to respective wear contributions indicative of a degree of wear of the engine; and means for evaluating the wear contributions to determine actual wear of the engine at any point in time.

15. The apparatus as defined in claim 14, further comprising means for converting the wear contributions to a uniform total degree of wear.

* * * * *